US009013024B2

(12) United States Patent
Lin et al.

(10) Patent No.: US 9,013,024 B2
(45) Date of Patent: Apr. 21, 2015

(54) SEMICONDUCTOR STRUCTURE AND PROCESS THEREOF

(71) Applicant: United Microelectronics Corp., Hsin-Chu (TW)

(72) Inventors: Ying-Chih Lin, Tainan (TW); Hsuan-Hsu Chen, Tainan (TW); Jiunn-Hsiung Liao, Tainan (TW); Lung-En Kuo, Chiayi County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/054,811

(22) Filed: Oct. 15, 2013

(65) Prior Publication Data

US 2014/0038417 A1 Feb. 6, 2014

Related U.S. Application Data

(62) Division of application No. 13/276,306, filed on Oct. 18, 2011.

(51) Int. Cl.
| H01L 29/66 | (2006.01) |
| H01L 21/311 | (2006.01) |
| H01L 21/308 | (2006.01) |
| H01L 21/84 | (2006.01) |
| H01L 27/12 | (2006.01) |
| H01L 29/78 | (2006.01) |

(52) U.S. Cl.
CPC .......... *H01L 21/311* (2013.01); *H01L 21/3083* (2013.01); *H01L 21/845* (2013.01); *H01L 27/1211* (2013.01); *H01L 29/66795* (2013.01); *H01L 29/7851* (2013.01)

(58) Field of Classification Search
USPC .................................. 257/510; 438/220–224
See application file for complete search history.

(56) References Cited

U.S. PATENT DOCUMENTS

| 5,013,680 | A | 5/1991 | Lowrey |
| 6,110,797 | A | 8/2000 | Perry |
| 6,150,212 | A | 11/2000 | Divakaruni |
| 6,734,524 | B1 | 5/2004 | Parthasarathy |
| 7,416,956 | B2 | 8/2008 | Yuan |
| 7,727,848 | B2 | 6/2010 | Furukawa |
| 7,867,845 | B2 | 1/2011 | Tang |
| 2002/0090795 | A1 | 7/2002 | Ahn |
| 2005/0064678 | A1 | 3/2005 | Dudek |
| 2005/0085042 | A1 | 4/2005 | Chun |
| 2005/0164468 | A1 | 7/2005 | Steegen |
| 2008/0119020 | A1* | 5/2008 | Grisham et al. ............. 438/221 |
| 2011/0081765 | A1* | 4/2011 | Cummings et al. .......... 438/424 |

* cited by examiner

*Primary Examiner* — Cheung Lee
*Assistant Examiner* — Frederick B Hargrove
(74) *Attorney, Agent, or Firm* — Winston Hsu; Scott Margo

(57) ABSTRACT

A semiconductor structure includes a substrate, a recess and a material. The recess is located in the substrate, wherein the recess has an upper part and a lower part. The minimum width of the upper part is larger than the maximum width of the lower part. The material is located in the recess.

14 Claims, 6 Drawing Sheets

SEMICONDUCTOR STRUCTURE AND PROCESS THEREOF

CROSS REFERENCE TO RELATED APPLICATIONS

This application is a divisional application of and claims the benefit of U.S. patent application Ser. No. 13/276,306, filed Oct. 18, 2011.

BACKGROUND OF THE INVENTION

1. Field of the Invention

The present invention relates generally to a semiconductor structure and process thereof, and more specifically, to a semiconductor structure and process thereof, which laterally etches a part of a recess to make parts of the recess have different widths or different slopes of sidewalls.

2. Description of the Prior Art

With increasing miniaturization of semiconductor devices, various Fin-shaped field effect transistor (FinFET) devices have been developed. The Fin-shaped field effect transistor (FinFET) is advantageous for the following reasons. First, manufacturing processes of Fin-shaped field effect transistor (FinFET) devices can be integrated into traditional logic device processes, and thus are more compatible. In addition, since the three-dimensional structure of the FinFET increases the overlapping area between the gate and the substrate, the channel region is controlled more effectively. This therefore reduces drain-induced barrier lowering (DIBL) effect and short channel effect. Moreover, the channel region is longer for the same gate length. Therefore, the current between the source and the drain is increased.

The Fin-shaped field effect transistor (FinFET) includes a plurality of fin-shaped structures, and gate structures disposed across them. Therefore, the sidewall of the upper part of the recess between each fin-shaped structure is covered by gate structures and the inclined angle of the sidewall of the upper part of the recess would affect the shape of gate structures. In general, the sidewall of the upper part of the recess is preferred to be a vertical sidewall for approaching the demands of the gate structures disposed across the fin-shaped structures, thereby the electrical performance of the Fin-shaped field effect transistor (FinFET) can be achieved. However, the sidewall of the recess etched by current processes has an inclined angle that can not approach the structural demand of a Fin-shaped field effect transistor (FinFET).

SUMMARY OF THE INVENTION

The present invention provides a semiconductor structure and process thereof, which laterally etches the sidewall of the upper part of a recess, to make the minimum width of the upper part of the recess larger than the maximum width of the lower part; or, to make the inclined angle of the sidewall of the upper part of the recess different from inclined angle of the sidewall of the lower part of the recess.

The present invention provides a semiconductor structure including a substrate, a recess and a material. The recess is located in the substrate, wherein the recess has an upper part and a lower part. The minimum width of the upper part is larger than the maximum width of the lower part. The material is located in the recess.

The present invention provides a semiconductor process including the following steps. A substrate is provided. A recess is formed in the substrate and the recess has a first sidewall. A material is filled in the recess and a part of the recess is exposed. An etching process is performed to laterally etch the exposing part of the recess, therefore the recess includes an upper part and a lower part, wherein the upper part has a second sidewall and the lower part has the first sidewall.

The present invention provides a semiconductor structure and process thereof, which performs an etching process to laterally etch the recess, and the desired sidewall profile of the recess is therefore formed.

These and other objectives of the present invention will no doubt become obvious to those of ordinary skill in the art after reading the following detailed description of the preferred embodiment that is illustrated in the various figures and drawings.

DETAILED DESCRIPTION

A Fin-shaped field effect transistor (FinFET) applying the present invention is used as an example illustrated in the following, but the present invention is not merely suited for forming a Fin-shaped field effect transistor (FinFET). The present invention can also be applied to form other semiconductor components, which change recess profiles by performing etching processes. Besides, the Fin-shaped field effect transistor (FinFET) applying the present invention has particular features, which are described as follows.

Figure 1:
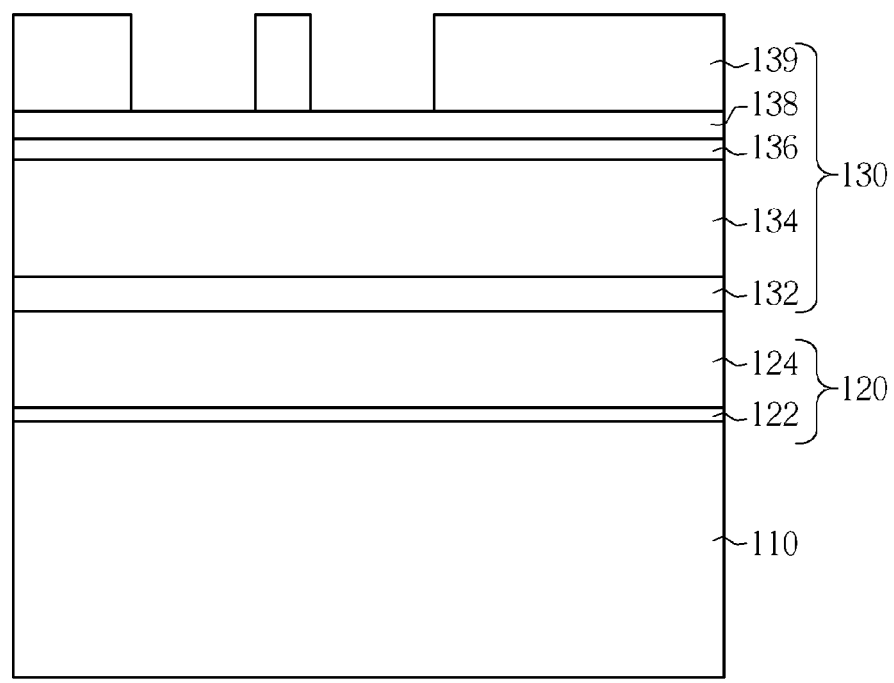
FIGS. 1-11 schematically depict a cross-sectional view of a semiconductor process according to one preferred embodiment of the present invention.

FIGS. 1-11 schematically depict a cross-sectional view of a semiconductor process according to one preferred embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. A pad oxide layer 122 and a pad nitride layer 124 are sequentially formed on the substrate 110. The pad oxide layer 122 includes an oxide layer, which may be formed by a thermal oxide process, a chemical oxide process, a chemical deposition process, etc. If the substrate 110 is a silicon substrate, the pad oxide layer 122 may be a silicon oxide layer formed by a thermal oxide layer. The pad nitride layer 124 includes a nitride layer, which may be formed by a physical vapor deposition (PVD) process, a chemical vapor deposition (CVD) process or other suitable processes. The pad oxide layer 122 and the pad nitride layer 124 constitute a hard mask layer 120, for etching the substrate 110 in the following processing steps. A mask layer 130 is formed to pattern the hard mask layer 120. The mask layer 130 may be a single layer structure or a multi-layer structure. In this embodiment, the mask layer 130 is a multi-layer structure composed of an oxide layer 132, an advance patterning film 134, a dielectric anti-reflection coating (DARC) layer 136, a bottom anti-reflective coating (BARC) layer 138, a photoresist layer 139, etc. As shown in the figure, the oxide layer 132, the advance patterning film 134, the dielectric anti-reflection coating (DARC) layer 136, the bottom anti-reflective coating (BARC) layer 138 and the photoresist layer 139 are sequentially formed on the hard mask layer 120. Then, the mask layer 130 is patterned. For instance, the photoresist layer 139 is patterned by exposing once or many times and then the pattern of the photoresist layer 139 is transferred once or many times to the bottom anti-reflective coating (BARC) layer 138, the dielectric anti-reflection coating (DARC) layer 136, the advance patterning film 134 and the oxide layer 132.

Figure 2:
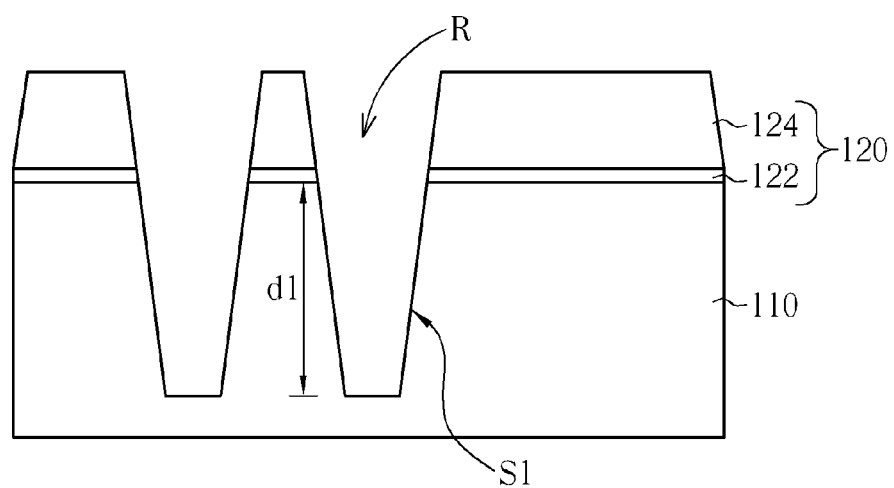

As shown in FIG. 2, the hard mask layer 120 is patterned by using the mask layer 130 as a mask and then the mask layer 130 is removed. The substrate 110 is etched by the hard mask layer 120 and at least a recess R is formed. There are two common recesses depicted in the figure, but the numbers or sizes of the recesses applying the present invention are not limited. The size of each recess may be common or different. As the recesses have different sizes, the depths of the recesses are different. The recess R has a first sidewall S1, and the recess R has a first predetermined depth d1. In this embodiment, the first sidewall S1 is an upward-broadened oblique sidewall. In another embodiment, the first sidewall S1 may have another shape. In this embodiment, the first predetermined depth d1 is 2000 angstroms, according to the processing size commonly used in modern processes, but it is not limited thereto.

Figure 3:
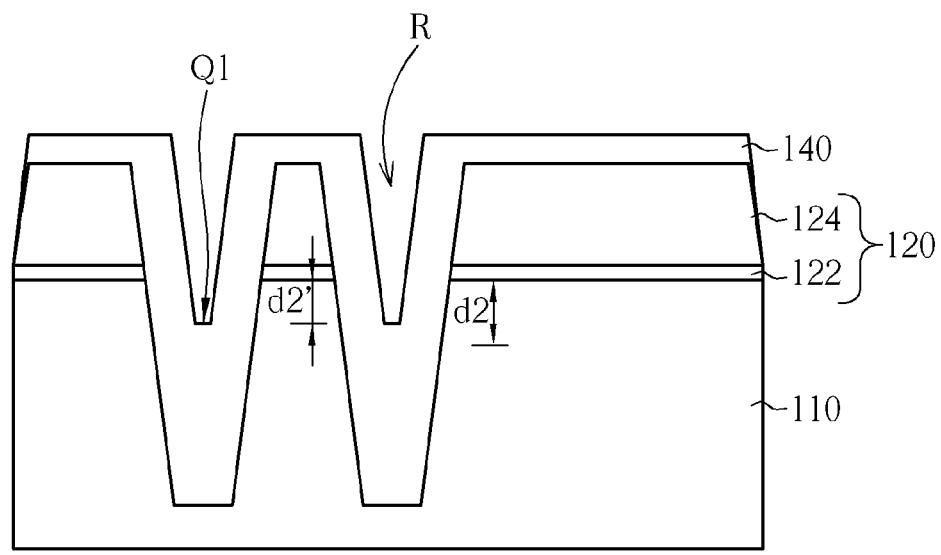
Figure 4:
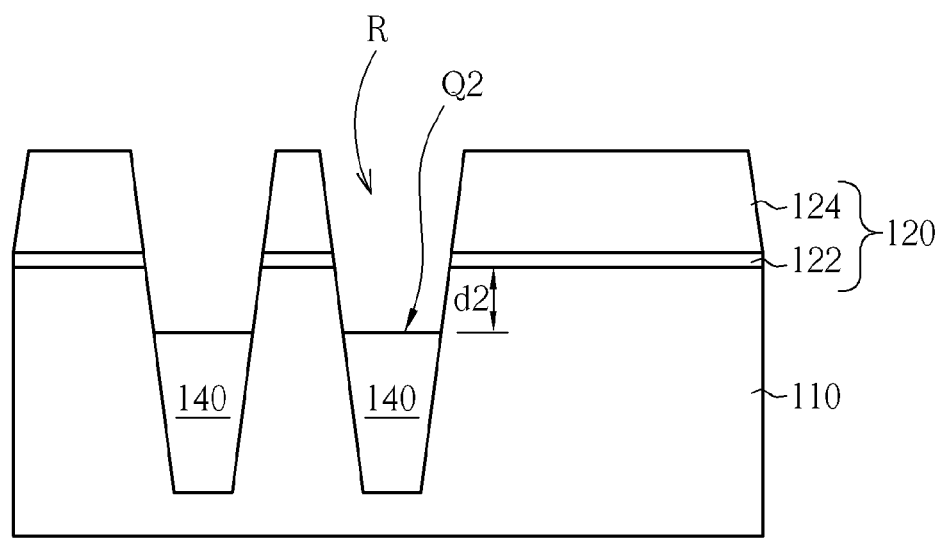

As shown in FIGS. 3-4, a material 140 is filled in the recess R and a part of the recess R is exposed, wherein the material of the material 140 may be oxide, and the part of the recess R has a second predetermined depth d2. In detail, as shown in FIG. 3, the material 140 entirely covers the recess R and the hard mask layer 120. The material 140 may fill up or partially fill the recess R, as long as the depth d2' of the top surface Q1 of the material 140 is smaller than the second predetermined depth d2. As shown in FIG. 4, the material 140 is etched back until exposing the part of recess with the second predetermined depth d2. That is, the distance between the surface Q2 of the material 140 and the top surface the substrate 110 is equal to the second predetermined depth d2. Preferably, the surface Q2 of the material 140 is essentially parallel with a level and the surface Q2 of the material 140 is a flat surface.

Figure 5:
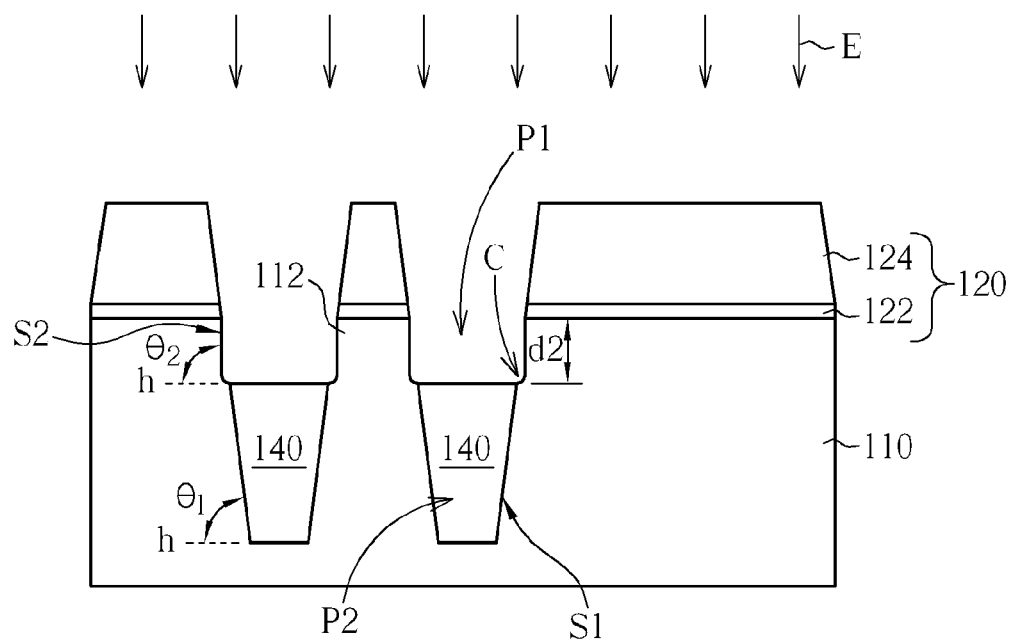

As shown in FIG. 5, an etching process E is performed to laterally etch the exposing part of the recess R. Therefore, the recess R includes an upper part P1 and a lower part P2 which are formed at the same time. The minimum width of the upper part P1 is larger than the maximum width of the lower part P2. The etching process E may include a dry etching process, such as a tetrafluoromethane, helium and oxygen containing dry etching process, but it is not limited thereto. As the etching process E is a dry etching process, the sidewall profile of the exposing part of the recess R, such as the inclined angle or the shape of the sidewall, can be controlled precisely by adjusting the processing parameters.

In this embodiment, the connecting point of the upper part P1 and the lower part P2 has a turning point C. The present invention is applied to form a Fin-shaped field effect transistor (FinFET) in this embodiment. The upper part P1 has a second sidewall S2 and the lower part P2 has the first sidewall S1, wherein a first projection line substantially coplanar and parallel to the first sidewall S1 of the lower part P2 of the recess R intersects at a first point with a second projection line substantially coplanar and parallel to a top surface of a pad nitride layer 124 formed above the substrate 110, whereby the second sidewall S2 at the upper part P1 of the recess R has one end thereof formed at the first point, and the other end of the second sidewall S2 forms the turning point C. The first sidewall S1 and the second sidewall S2 are upward-broadened oblique sidewalls. The acute angle θ2 between the second sidewall S2 and a level h is larger than the acute angle θ1 between the first sidewall S1 and the level h. In a preferred embodiment, the acute angle θ2 between the second sidewall S2 and the level h is larger than 89°. In a still preferred embodiment, the second sidewall S2 is essentially vertical to the level h. In doing this, a plurality of protruding parts 112 of the substrate 110 are suited for use as fin-shaped structures of a Fin-shaped field effect transistor (FinFET). The numbers of the protruding parts 112 depend upon the needs. In this embodiment, the etching process E just laterally etches the exposing part of the recess R and the upper part P1 is therefore formed. So, the length of the second sidewall S2 of the upper part P1 is equal to the second predetermined depth d2. If the first predetermined depth d1 is 2000 angstroms, the second predetermined depth d2 is preferred to be 400 angstroms (which is the thickness of the fin-shaped structures of the following formed Fin-shaped field effect transistor (Fin-FET)).

Figure 6:
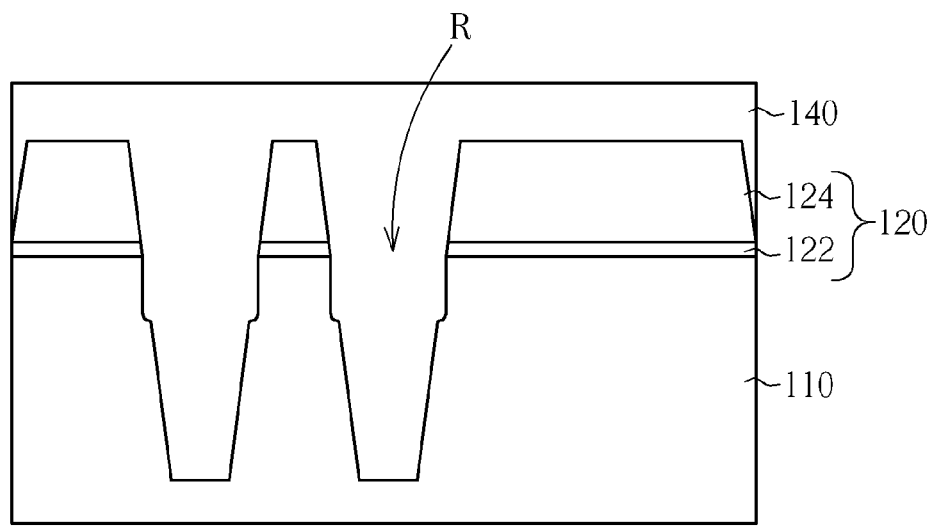
Figure 7:
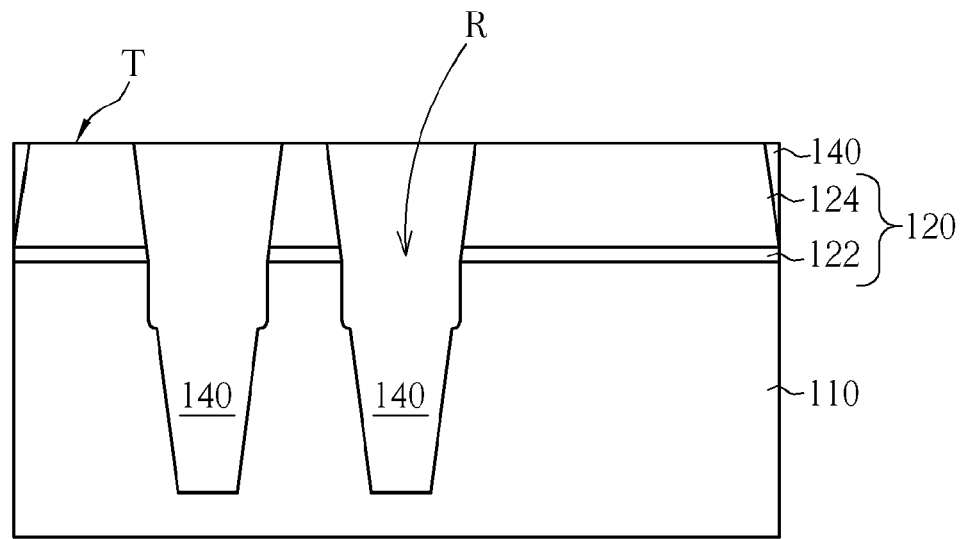
Figure 8:
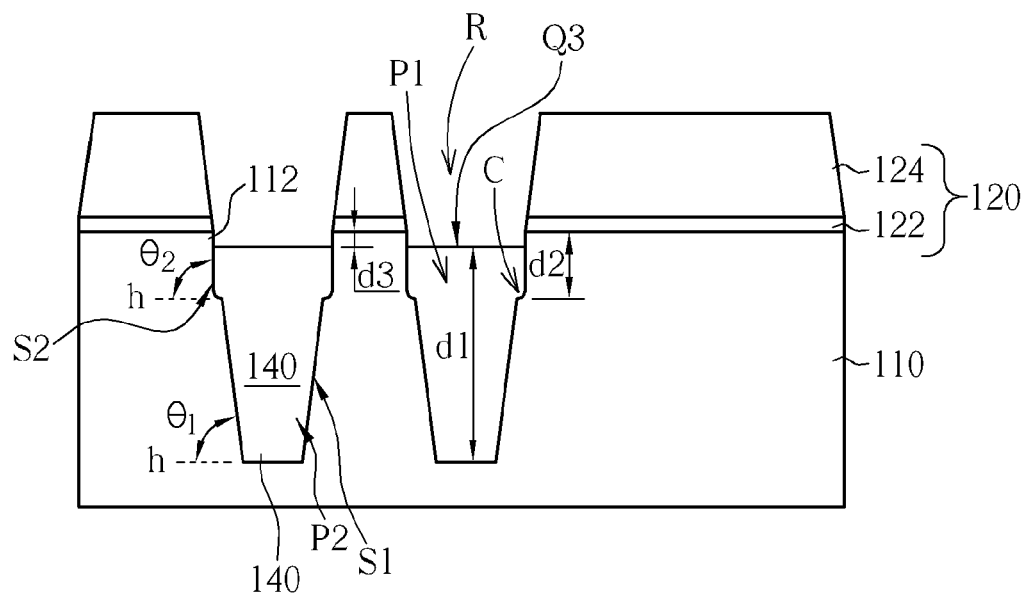

As shown in FIGS. 6-8, the material 140 is filled in the recess R and a part of the recess R with a third predetermined depth d3 is exposed. The processing steps include: as shown in FIG. 6, the material 140 entirely covers the recess R and the hard mask layer 120. As shown in FIG. 7, the material 140 is polished by methods such as a chemical mechanical polishing (CMP) process and the top surface of the material 140 therefore flushes with the top surface T of the hard mask layer 120. As shown in FIG. 8, the material 140 is etched back until exposing the part of the recess R with the third predetermined depth d3. That is, the distance between the top surface Q3 of the material 140 and the top surface of the substrate 110 is equal to the third predetermined depth d3. In this embodiment, the third predetermined depth d3 is preferred to be 250 angstroms (which is the thickness that a gate structure of the following formed Fin-shaped field effect transistor (FinFET) can be disposed thereon).

Figure 9:
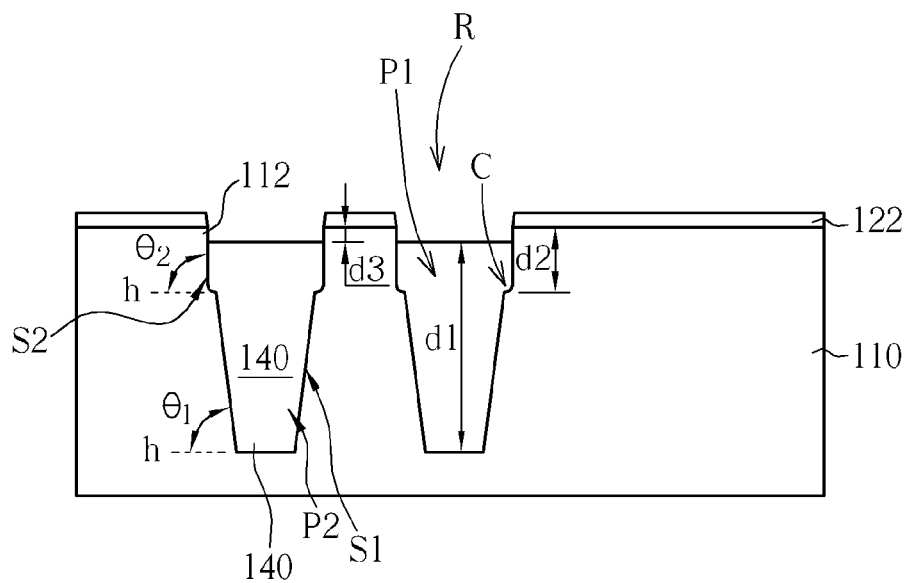
Figure 10:
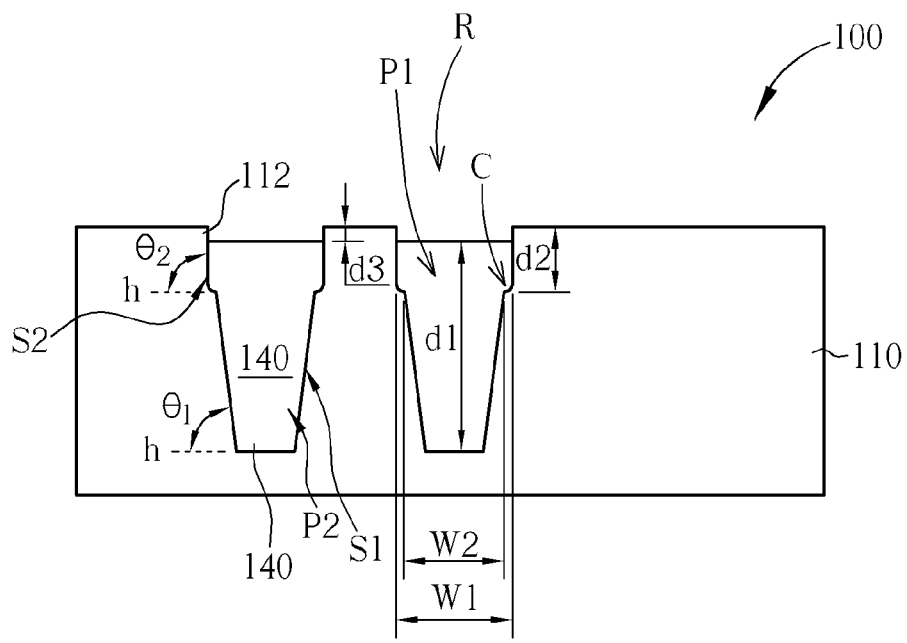

As shown in FIG. 9, the pad nitride layer 124 is removed. As shown in FIG. 10, the pad oxide layer 122 is removed, meaning the semiconductor structure 100 is complete.

According to the above, the semiconductor structure 100 shown in FIG. 10 is formed. The semiconductor structure 100 includes the substrate 110, the recess R and the material 140. The recess R having an upper part P1 and a lower part P2 is located in the substrate 110. The minimum width w1 of the upper part P1 is larger than the maximum w2 of the lower part P2. The material 140 is located in the recess R.

The connecting point of the upper part P1 and the lower part P2 has a turning point C. The semiconductor structure 100 is used to form a Fin-shaped field effect transistor (FinFET) in this embodiment. The upper part P1 has the second sidewall S2 and the lower part P2 has the first sidewall S1. The first sidewall S1 and the second sidewall S2 are upward-broadened oblique sidewalls. The acute angle $\theta_2$ between the second sidewall S2 and the level h is larger than the acute angle $\theta_1$ between the first sidewall S1 and the level h. In a preferred embodiment, the acute angle $\theta_2$ between the second sidewall S2 and the level h is larger than 89°. In a still preferred embodiment, the second sidewall S2 is essentially vertical to the level h. In doing this, a plurality of protruding parts 112 of the substrate 110 can be fin-shaped structures of a Fin-shaped field effect transistor (FinFET), suited for having a gate structure formed thereon. If the first predetermined depth d1 is 2000 angstroms, the second predetermined depth d2 is preferred to be 400 angstroms and the third predetermined depth d3 is preferred to be 250 angstroms.

Figure 11:
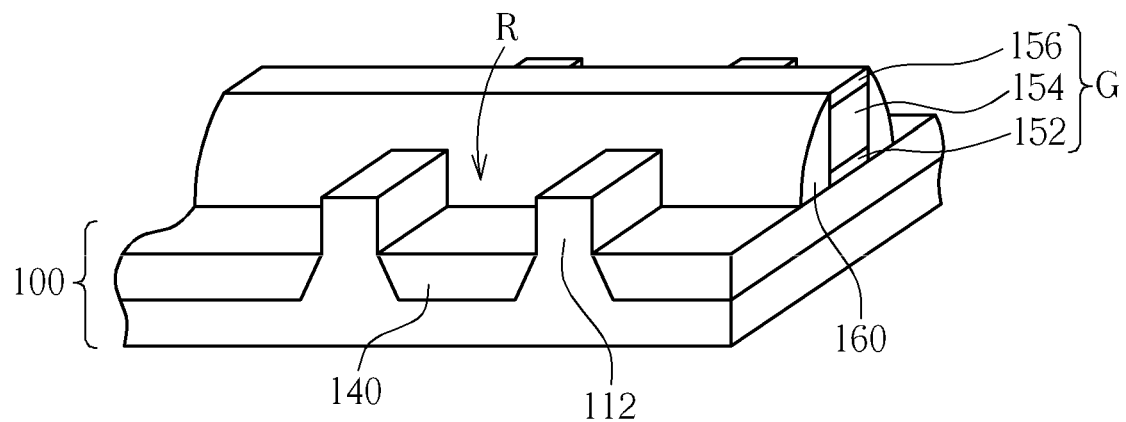

As shown in FIG. 11, after the semiconductor 100 is complete, a Fin field-effect transistor, a Tri-gate MOSFET or etc. may be sequentially formed. For example, a gate dielectric layer (not shown), a gate electrode layer (not shown) and a cap layer (not shown) cover the protruding parts 112 and the material 140. The cap layer (not shown), the gate electrode layer (not shown) and gate dielectric layer (not shown) are patterned to form a gate structure G, wherein the gate structure G includes a gate dielectric layer 152, a gate electrode layer 154 and a cap layer 156. A spacer 160 is formed beside the gate structure G. An ion implantation process is performed to form a source/drain region in each protruding parts 112 beside the spacer; and so on. The method of forming the gate structure is known in the art, and is not described herein. Each protruding parts 112 are used as a fin-shaped structure of a Fin field-effect transistor, a Tri-gate MOSFET or etc. The material 140 located in the recess R is used to isolate transistors on each protruding parts 112.

To summarize, the present invention provides a semiconductor structure and process thereof, which performs an etching process to laterally etch the part of the recess for forming the desired sidewall profile of the recess. The etching process E may include a dry etching process, such as a tetrafluoromethane, helium and oxygen containing dry etching process. As the etching process E is a dry etching process, the sidewall profile of the exposing part of the recess R can be controlled precisely by adjusting the processing parameters.

For example, as the present invention is applied to form the Fin-shaped field effect transistor (FinFET), the upper part of the sidewall of the recess is laterally etched to make the upper part of the sidewall of the recess approximately vertical to the level. Thus, the protruding parts of the substrate beside the recess is suited for a gate structure formed thereon, thereby the electrical performance of the Fin-shaped field effect transistor (FinFET) can improve. Due to the material filling in the recess twice in the present invention (the material filling in the recess in the first time is shown in FIG. 3-4 and the material filling in the recess in the second time is shown in FIG. 6-8), the material in the semiconductor structure formed by the present invention will not have voids in it.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process, comprising:
providing a substrate;
forming a recess in the substrate, wherein the recess has a first sidewall and the first sidewall is a straight sidewall;
filling an isolation material in the recess and exposing a part of the recess;
performing an etching process to laterally etch the exposing part of the recess, the result being the recess comprises an upper part and a lower part, wherein the upper part has a second sidewall and the lower part has the first sidewall being formed simultaneously, and a first projection line substantially coplanar and parallel to the first sidewall of the lower part of the recess intersects at a first point with a second projection line substantially coplanar and parallel to a top surface of a pad nitride layer formed above the substrate, whereby the second sidewall at the upper part of the recess has one end thereof formed at the first point, and the other end of the second sidewall forms the turning point; and
filling the isolation material in the recess after the etching process is performed.

2. The semiconductor process according to claim 1, wherein the connecting point of the upper part and the lower part has a turning point.

3. The semiconductor process according to claim 1, wherein the first sidewall and the second sidewall are upward-broadened oblique sidewalls.

4. The semiconductor process according to claim 3, wherein the acute angle between the second sidewall and a level is larger than the acute angle between the first sidewall and a level.

5. The semiconductor process according to claim 4, wherein the acute angle between the second sidewall and a level is larger than 89°.

6. The semiconductor process according to claim 1, wherein the second sidewall is essentially vertical to a level.

7. The semiconductor process according to claim 1, wherein the recess has a first predetermined depth, and the part of the recess and the upper part have a second predetermined depth.

8. The semiconductor process according to claim 7, wherein the first predetermined depth is 2000 angstroms and the second predetermined depth is 400 angstroms.

9. The semiconductor process according to claim 7, wherein the steps of filling the material in the recess comprise:
filling the material until the material is higher than the second predetermined depth; and
etching back the material until exposing the part of the recess with the second predetermined depth.

10. The semiconductor process according to claim 7, after performing the etching process, further comprising:
filling the material in the recess until exposing a part of the recess with a third predetermined depth.

11. The semiconductor process according to claim 10, wherein the second predetermined depth is larger than the third predetermined depth.

12. The semiconductor process according to claim 11, wherein the first predetermined depth is 2000 angstroms, the second predetermined depth is 400 angstroms and the third predetermined depth is 250 angstroms.

13. The semiconductor process according to claim 1, wherein the etching process comprises a dry etching process.

14. The semiconductor process according to claim 13, wherein the dry etching process comprises a tetrafluoromethane, helium and oxygen containing dry etching process.

* * * * *